United States Patent
Sato et al.

(10) Patent No.: US 9,997,448 B1
(45) Date of Patent: Jun. 12, 2018

(54) WIRING SUBSTRATE

(71) Applicant: SHINKO ELECTRIC INDUSTRIES CO., LTD., Nagano-shi, Nagano-ken (JP)

(72) Inventors: Kiyokazu Sato, Nagano (JP); Mitsuyoshi Imai, Nagano (JP); Osamu Hoshino, Nagano (JP)

(73) Assignee: Shinko Electric Industries Co., Ltd (JP)

( * ) Notice: Subject to any disclaimer, the term of this patent is extended or adjusted under 35 U.S.C. 154(b) by 0 days. days.

(21) Appl. No.: 15/805,660

(22) Filed: Nov. 7, 2017

(30) Foreign Application Priority Data

Dec. 9, 2016 (JP) .................. 2016-239399

(51) Int. Cl.
H01L 23/52 (2006.01)
H01L 23/538 (2006.01)
H05K 1/18 (2006.01)
H01L 23/498 (2006.01)
H01L 23/00 (2006.01)
H01L 21/48 (2006.01)
H05K 1/02 (2006.01)
H05K 1/11 (2006.01)
(Continued)

(52) U.S. Cl.
CPC ...... H01L 23/49838 (2013.01); H01L 21/486 (2013.01); H01L 21/4857 (2013.01); H01L 23/4985 (2013.01); H01L 23/49822 (2013.01); H01L 23/49827 (2013.01); H01L 24/16 (2013.01); H05K 1/028 (2013.01); H05K 1/118 (2013.01); H05K 1/18 (2013.01); H05K 3/061 (2013.01); H05K 3/4038 (2013.01); H01L 2224/16227 (2013.01)

(58) Field of Classification Search
CPC ........ H01L 23/49827; H01L 23/49822; H01L 23/481; H01L 23/4985; H01L 24/48; H01L 24/16; H01L 23/5387; H01L 21/486; H05K 1/18; H05K 1/028; H05K 1/118; H05K 1/113; H05K 1/181
See application file for complete search history.

(56) References Cited

U.S. PATENT DOCUMENTS 5,451,721 A * 9/1995 Tsukada ............... H05K 1/0265
174/261
5,710,071 A * 1/1998 Beddingfield ........ H01L 21/563
257/778

(Continued)

FOREIGN PATENT DOCUMENTS

JP 2006-278774 A 10/2006

Primary Examiner — Jasmine Clark
(74) Attorney, Agent, or Firm — Tarolli, Sundheim, Covell & Tummino LLP

(57) ABSTRACT

A wiring substrate includes a flexible insulation substrate, a first wiring layer formed on an upper surface of the insulation substrate, a second wiring layer formed on a lower surface of the insulation substrate, and through wiring bonded to the first wiring layer and the second wiring layer and formed in a through hole extending through the first wiring layer, the insulation substrate, and the second wiring layer. The through wiring includes a projection that extends along a lower surface of the second wiring layer located outside the through hole. An upper surface of the through wiring is flush with an upper surface of the first wiring layer.

7 Claims, 5 Drawing Sheets

(51) Int. Cl.
*H05K 3/06* (2006.01)
*H05K 3/40* (2006.01)

(56) References Cited

U.S. PATENT DOCUMENTS

2004/0238209 A1* 12/2004 Yuri .................. H05K 1/056
                                                174/257
2009/0283301 A1* 11/2009 Takahashi ............ H05K 3/4691
                                                174/254

* cited by examiner

WIRING SUBSTRATE

CROSS-REFERENCE TO RELATED APPLICATIONS

This application is based upon and claims the benefit of priority from prior Japanese Patent Application No. 2016-239399, filed on Dec. 9, 2016, the entire contents of which are incorporated herein by reference.

FIELD

This disclosure relates to a wiring substrate and a method for manufacturing a wiring substrate.

BACKGROUND

A wiring substrate known in the art includes wiring layers that are formed on upper and lower surfaces of an insulation layer and via wirings that connect the upper and lower wiring layers to each other. In such a wiring substrate, copper foils are adhered to the upper and lower surfaces of the insulation layer. After forming a through hole in the insulation layer adhered with the copper foils, a seed layer is formed on each copper foil and the wall of the through hole. Then, electrolytic copper plating is performed using the seed layer as a power feeding electrode to form via wirings with the copper plating film formed on the surfaces of the seed layer. Subsequently, etching is performed to pattern each copper foil. This completes the wiring substrate. Japanese Laid-Open Patent Publication No. 2006-278774 discloses such a conventional wiring substrate.

SUMMARY

There is a demand for the formation of finer wiring on a wiring substrate. In a wiring substrate such as that described above, a conductive layer is formed by the copper foils, the seed layer, and the copper plating film. The thickness and unevenness in thickness of such a conductive layer may hinder the formation of fine wiring.

One embodiment is a wiring substrate including a flexible insulation substrate, a first wiring layer formed on an upper surface of the insulation substrate, a second wiring layer formed on a lower surface of the insulation substrate, and a through wiring formed in a through hole extending through the first wiring layer, the insulation substrate, and the second wiring layer. The through wiring is bonded to the first wiring layer and the second wiring layer. The through wiring includes a projection that extends along a lower surface of the second wiring layer located outside the through hole. An upper surface of the through wiring is flush with an upper surface of the first wiring layer.

A further embodiment is a method for manufacturing a wiring substrate. The method includes preparing a clad laminate including a flexible insulation substrate, a first metal foil for a first wiring layer formed on an upper surface of the insulation substrate, and a second metal foil for a second wiring layer formed on a lower surface of the insulation substrate; forming a first etching mask that covers the second metal foil and includes an opening; forming the second wiring layer by patterning the second metal foil using the first etching mask; removing the first etching mask; forming a plating mask that covers the second wiring layer; forming a through hole that extends through the first metal foil, the insulation substrate, and the second wiring layer by performing stamping; closing the through hole by applying mask material to an upper surface of the first metal foil; forming through wiring in the through hole by performing electrolytic plating using the first metal foil as a power feeding electrode; removing the plating mask and the mask material; forming a second etching mask that covers the first metal foil and includes an opening; forming the first wiring layer by patterning the first metal foil using the second etching mask; and removing the second etching mask.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
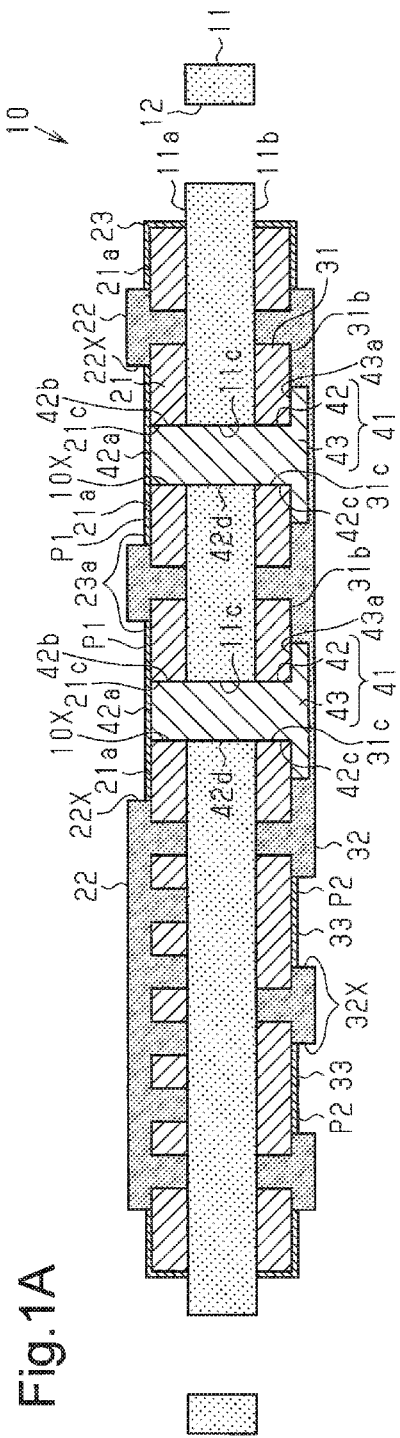
FIG. 1A is a schematic cross-sectional view of a wiring substrate.

In the drawings, elements are illustrated for simplicity and clarity and have not necessarily been drawn to scale. To facilitate understanding, hatching lines may not be illustrated or be replaced by shadings in the cross-sectional drawings.

Referring to FIG. 1A, a wiring substrate 10 includes an insulation substrate 11, wiring layers 21 and 31, through wirings 41, protective layers 22 and 32, and surface-processed layers (surface finish layer) 23, 23a, and 33.

The insulation substrate 11 is formed from a flexible and insulative material. The insulation substrate 11 may be, for example, a flexible film substrate of a liquid crystal polymer or a resin such as a polyimide resin or a polyester resin.

The insulation substrate 11 may have a thickness of, for example, approximately 12 to 50 μm. In the present example, the insulation substrate 11 has a thickness of 25 μm. The insulation substrate 11 includes sprocket holes 12. The sprocket holes 12 extend through the insulation substrate 11 in the thickness-wise direction of the insulation substrate 11.

The wiring layer 21 is formed on an upper surface 11a of the insulation substrate 11. The wiring layer 21 is patterned into desired planar shapes laid out at a fine pitch. The wiring layer 21 may be formed from, for example, copper (Cu) or a Cu alloy. The wiring layer 21 may have a thickness of, for example, approximately 9 to 25 μm. In the present example, the wiring layer 21 has a thickness of 18 μm. When the thickness of the wiring layer 21 is 18 μm, the line and space (L/S) may be set to, for example, 16 μm/16 μm. The line and space is defined as the wiring width (L)/wiring interval (S).

The wiring layer 31 is formed on a lower surface 11b of the insulation substrate 11. The wiring layer 31 is patterned into desired planar shapes laid out at a fine pitch. The wiring layer 31 may be formed from, for example, copper (Cu) or a Cu alloy. The wiring layer 31 may have a thickness of, for example, approximately 9 to 25 µm. In the present example, the wiring layer 31 has a thickness of 18 µm. When the thickness of the wiring layer 31 is 18 µm, the line and space (L/S) may be set to, for example, 16 µm/16 µm.

The wiring substrate 10 includes through holes 10X. The through holes 10X extend through the wiring layer 21, the insulation substrate 11, and the wiring layer 31. Accordingly, each through hole 10X includes a through hole extending through the wiring layer 21, a through hole extending through the insulation substrate 11, and a through hole extending through the wiring layer 31. Each through hole 10X has a planar shape (shape as viewed from above in FIG. 1A) that is, for example, circular. The size (diameter) of each through hole 10X may be, for example, approximately 100 to 200 µm. In the present example, the size of each through hole 10X is 100 µm. The through holes 10X are formed through, for example, a stamping process that uses a die or the like.

Each through wiring 41 includes a barrel 42, which fills the corresponding through hole 10X, and a projection 43, which projects downward from a lower surface 31b of the wiring layer 31.

The upper end of the barrel 42 coincides with the upper end of each through hole 10X formed in the wiring layer 21. The barrel 42 includes an upper surface 42a that is flat. Further, the upper surface 42a of the barrel 42 is flush with an upper surface 21a of the wiring layer 21. An upper end portion of the barrel 42 includes a circumferential surface 42b, and an upper end portion of the corresponding through hole 10X is defined by an inner surface portion 21c of the wiring layer 21. The circumferential surface 42b is directly bonded to the inner surface portion 21c.

The lower end of the barrel 42 coincides with the lower end of each through hole 10X formed in the wiring layer 31. A lower end portion of the barrel 42 includes a circumferential surface 42c, and a lower end portion of the corresponding through hole 10X is defined by an inner surface portion 31c of the wiring layer 31. The circumferential surface 42c is directly bonded to the inner surface portion 31c.

The projection 43, which is located downward from the lower surface 31b of the wiring layer 31, extends in an annular manner on the lower surface 31b of the wiring layer 31 located at the outer side of the lower end portion of the corresponding through hole 10X. The projection 43 includes an upper surface 43a directly bonded to the lower surface 31b of the wiring layer 31.

In this manner, each through wiring 41 is electrically connected to the wiring layer 21 by the circumferential surface 42b of the upper end portion of the barrel 42. Further, each through wiring 41 is electrically connected to the wiring layer 31 by the circumferential surface 42c of the lower end portion of the barrel 42 and the upper surface 43a of the projection 43.

Each barrel 42 includes a middle circumferential surface 42d that connects the circumferential surface 42b at the upper end portion and the circumferential surface 42c at the lower end portion. In the drawings, the middle circumferential surface 42d is illustrated in the same manner as the other circumferential surfaces 42b and 42c. Actually, the middle circumferential surface 42d only contacts an inner surface portion 11c of the insulation substrate 11 that defines the middle portion of the corresponding through hole 10X. In other words, the barrel 42 is not bonded to the insulation substrate 11.

Each projection 43 has a planar shape that is, for example, circular. The size (diameter) of each projection 43 is set in accordance with the size of each through hole 10X. Each projection 43 has a larger planar shape than the barrel 42 that is arranged in the corresponding through hole 10X. For example, the distance from each through hole 10X to the outer circumferential edge of the corresponding projection 43 in the radial direction of the through hole 10X and the projection 43 may be, for example, 50 to 100 µm, and the size (diameter) of each projection 43 may be, for example, approximately 200 to 250 µm. In the present example, the size of each projection 43 is 200 µm. The thickness of each projection 43 may be, for example, approximately 5 to 20 µm. In the present example, the thickness of each projection 43 is 5 µm. The through wirings 41 may be formed from, for example, Cu or a Cu alloy.

The protective layer 22 covers the upper surface 11a of the insulation substrate 11 and portions of the wiring layer 21. The protective layer 22 includes openings 22X that expose portions of the upper surface 21a of the wiring layer 21. The protective layer 22 may be formed from, for example, a photosensitive and insulative epoxy resin or a photosensitive and insulative acrylic resin.

The surface-processed layers 23 and 23a are formed on the surfaces of the wiring layer 21 exposed from the protective layer 22. The surface-processed layer 23a, which is exposed in each opening 22X of the protective layer 22, covers the upper surface 21a of the wiring layer 21 and the upper surface of each through wiring 41 (upper surface 42a of barrel 42). The upper surface of the surface-processed layer 23a functions as external connection terminals P1 that connect an electronic component 71 or the like to the wiring substrate 10.

Examples of the surface-processed layers 23 and 23a include a gold (Au) layer, a nickel (Ni)/Au layer (metal layer in which Ni layer is bottom layer and Au layer is formed on Ni layer), and an Ni/palladium (Pd)/Au layer (metal layer in which Ni layer is bottom layer, and Ni layer, Pd layer, and Au layer are stacked one after another). Further, the surface-processed layers 23 and 23a may be formed by performing an oxidation resistant treatment such as an organic solderability preservative (OSP) treatment. For example, when undergoing an OSP treatment, the surface-processed layers 23 and 23a are formed by an organic film of an azole compound, an imidazole compound, or the like.

The protective layer 32 covers the lower surface 11b of the insulation substrate 11, portions of the wiring layer 31, and the projections 43 of the through wirings 41. The protective layer 32 includes openings 32X that expose portions of the lower surface 31b of the wiring layer 31. The protective layer 32 may be formed from, for example, a photosensitive and insulative epoxy resin or a photosensitive and insulative acrylic resin.

The surface-processed layer 33 is formed on the surfaces of the wiring layer 31 exposed from the protective layer 32. The surface-processed layer 33 exposed in the openings 32X of the protective layer 32 functions as external connection terminals P2 that connect an electronic component 81 or the like to the wiring substrate 10.

In the same manner as the surface-processed layers 23 and 23a, examples of the surface-processed layer 33 include an Au layer, an Ni/Au layer, and an Ni/Pd/Au layer. Further, the surface-processed layer 33 may be formed by performing an oxidation resistant treatment such as an OSP treatment. For example, when undergoing an OSP treatment, the surface-processed layer 33 is formed by an organic film of an azole compound, an imidazole compound, or the like.

Figure 1B:
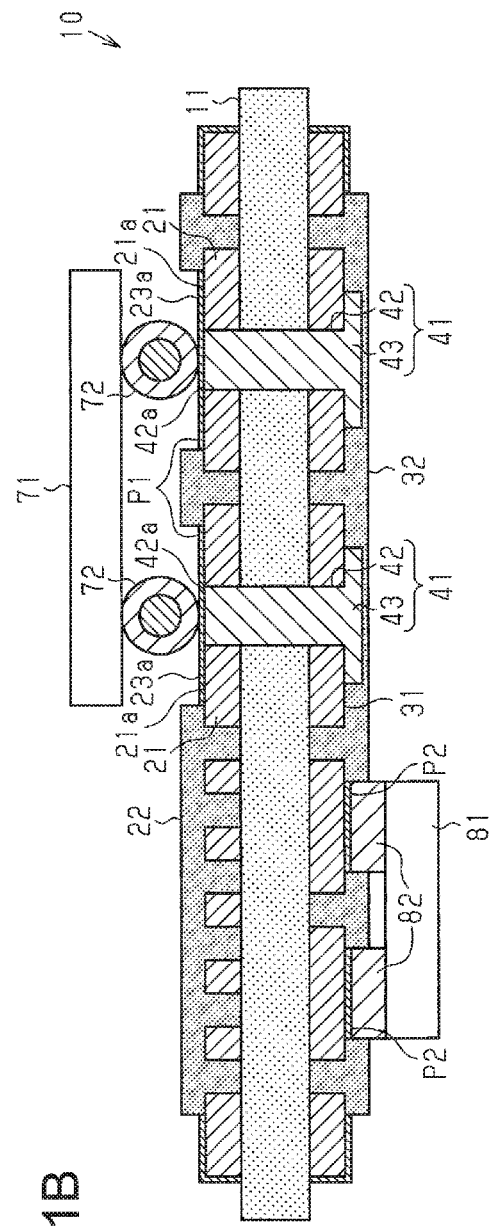
FIG. 1B is a schematic cross-sectional view of a semiconductor device including the wiring substrate of FIG. 1A.

FIG. 1B illustrates a mounting example of the electronic components 71 and 81. The electronic component 71 is mounted on the upper surface of the wiring substrate 10. The electronic component 71 is connected by solder balls 72 to the external connection terminals P1 of the wiring substrate 10. The solder balls 72 may each be structured by, for example, covering a conductive core ball (copper core ball or the like) or a resin core ball with solder. Alternatively, the solder balls 72 may each be less the conductive core ball or resin core ball. The electronic component 81 is mounted on the lower surface of the wiring substrate 10. The electronic component 81 is connected by solder 82 to the external connection terminals P2 of the wiring substrate 10.

A method for manufacturing the wiring substrate 10 will now be described. To facilitate understanding, elements ultimately included in the wiring substrate 10 are denoted by the same reference characters throughout the drawings. In FIGS. 2A to 5D, the reference characters of elements not related to the description of the manufacturing process may be omitted.

Figure 2A:
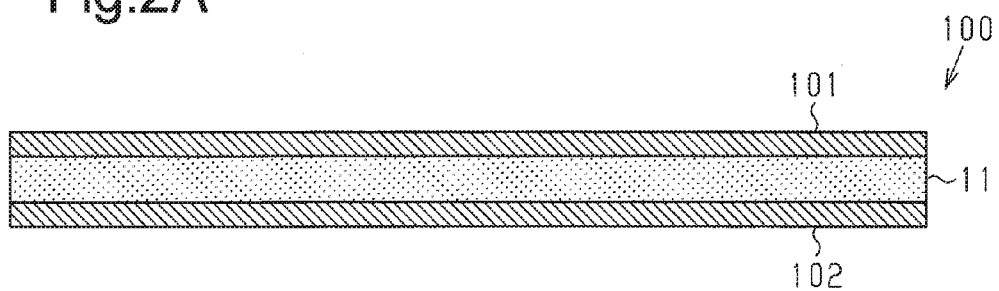
FIGS. 2A to 2D, 3A to 3D, 4A to 4D, and 5A to 5D are schematic cross-sectional views illustrating a method for manufacturing the wiring substrate of FIG. 1A.

Referring to FIG. 2A, a laminate substrate 100 is prepared. A flexible copper clad laminate (FCCL) may be used as the laminate substrate 100. The laminate substrate 100 includes the flexible insulation substrate 11, a copper foil 101 bonded to the upper surface of the insulation substrate 11, and a copper foil 102 bonded to the lower surface of the insulation substrate 11. In the present embodiment, the copper foils 101 and 102 are directly bonded onto the upper and lower surfaces of the insulation substrate 11. For example, the copper foils 101 and 102 are heated and pressed onto the upper and lower surfaces of the insulation substrate 11 when the insulation substrate 11 is in a semi-hardened state. This forms the laminate substrate 100.

Another example of a copper clad laminate (CCL) is a laminate substrate in which an adhesive is used to apply a copper foil to an insulation substrate. In such a laminate substrate, for example, the difference in the coefficient of thermal expansion between the adhesive and the substrate may cause delamination of the copper foil. In the laminate substrate 100 of the present embodiment, the copper foils 101 and 102 are directly connected to the upper and lower surfaces of the insulation substrate 11. Thus, there is no difference in the coefficient of thermal expansion between, for example, the adhesive and the substrate.

Figure 2B:
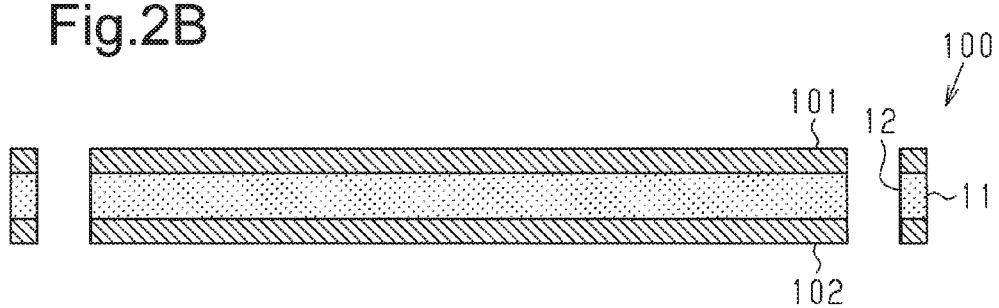

In the step of FIG. 2B, the sprocket holes 12 are formed in the insulation substrate 11. The sprocket holes 12 are formed through, for example, a stamping process that uses a die or the like. The sprocket holes 12 extend through the insulation substrate 11 and the copper foils 101 and 102.

Figure 2C:
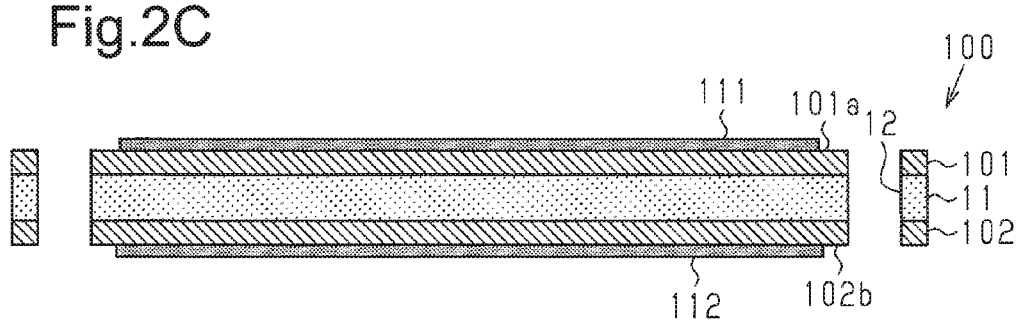

In the step of FIG. 2C, roll coating is performed to coat an upper surface 101a of the copper foil 101 and a lower surface 102b of the copper foil 102 with a photosensitive liquid resist (liquid photoresist) while smoothening the surface of the resist to form resist layers 111 and 112. The resist layers 111 and 112 each correspond to a first etching mask. The liquid photoresist may be, for example, a liquid resist such as a novolak resin or an acrylic resin. The use of a liquid photoresist allows the resist layers 111 and 112 to have a thickness of, for example, 3 to 5 μm. The use of such thin resist layers 111 and 112 allows the wiring layers 21 and 31 (refer to FIG. 1A) to be patterned with a fine pitch. When using a dry film resist, the resist layer will have a thickness of, for example, 18 to 90 μm.

Figure 2D:
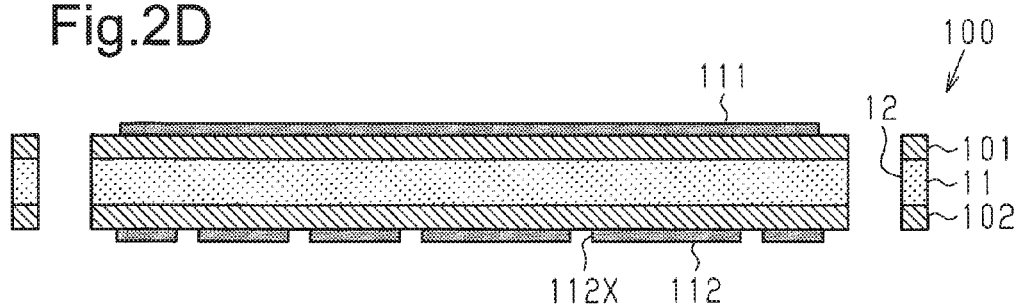

In the step of FIG. 2D, the resist layer 112 on the lower surface 102b of the copper foil 102 is exposed and developed to form openings 112X at given locations. The locations of the openings 112X correspond to the shape of the wiring patterns in the wiring layer 31 illustrated in FIG. 1A.

Figure 3A:
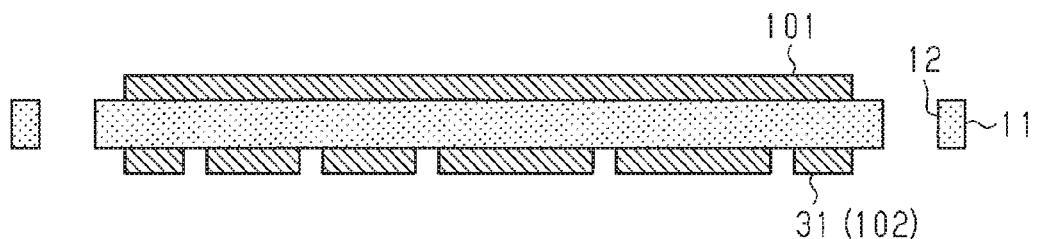

In the step of FIG. 3A, the copper foil 102 is patterned to form the wiring layer 31. Further, the copper foil 101 is patterned to a given size. The copper foil 101 is etched while using the resist layer 111 illustrated in FIG. 2D as an etching mask to pattern the copper foil 101 to a size that includes, for example, the wiring layer 21 illustrated in FIG. 1A. Further, the copper foil 102, which is exposed in the openings 112X of the resist layer 112, is etched while using the resist layer 112 illustrated in FIG. 2D as an etching mask to pattern the copper foil 102. This forms the wiring patterns in the wiring layer 31. Then, the resist layers 111 and 112 illustrated in FIG. 2D are removed. The resist layers 111 and 112 may be delaminated by, for example, an alkali delamination liquid.

Figure 3B:
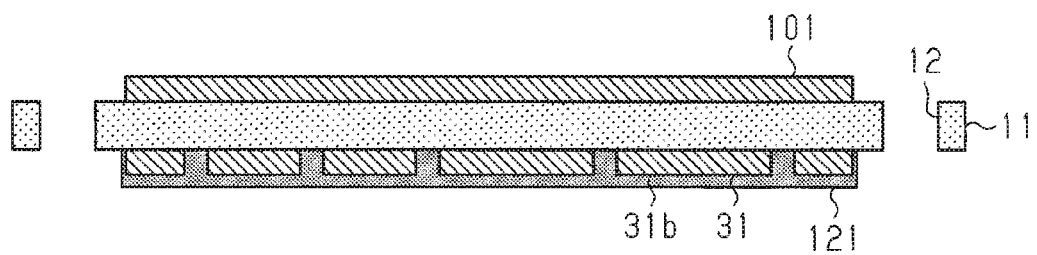

In the step of FIG. 3B, roll coating is performed to coat and cover the patterned wiring layer 31 with a liquid photoresist while smoothening the surface of the resist to form a resist layer 121 that serves as a plating mask. The resist layer 121 is formed to cover side surfaces of the wiring layer (surfaces at left and right ends of wiring layer 31 as viewed in FIG. 3A).

Figure 3C:
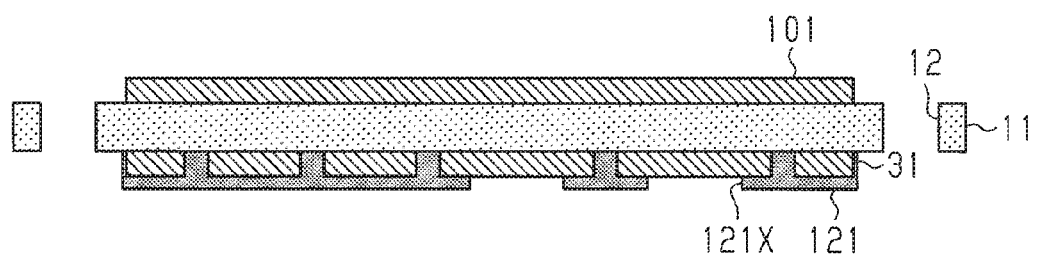

In the step of FIG. 3C, the resist layer 121 is exposed and developed to form openings 121X at given locations. The locations of the openings 121X correspond to the locations where the projections 43 of the through wirings 41 illustrated in FIG. 1A are formed.

Figure 3D:
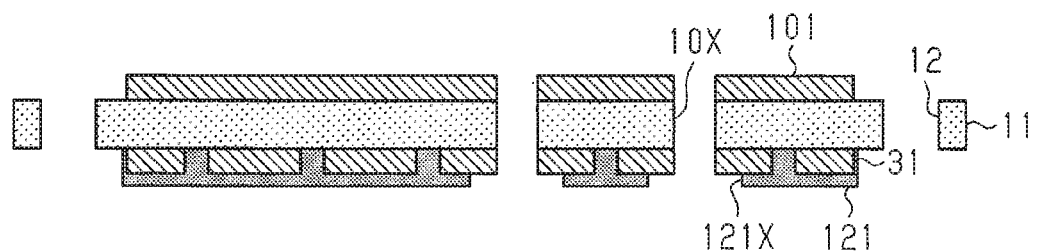

In the step of FIG. 3D, the through holes 10X are formed. For example, the laminate substrate 100 is set on a stamping machine. Then, a stamping process is performed using a die to form the through holes 10X.

Figure 4A:
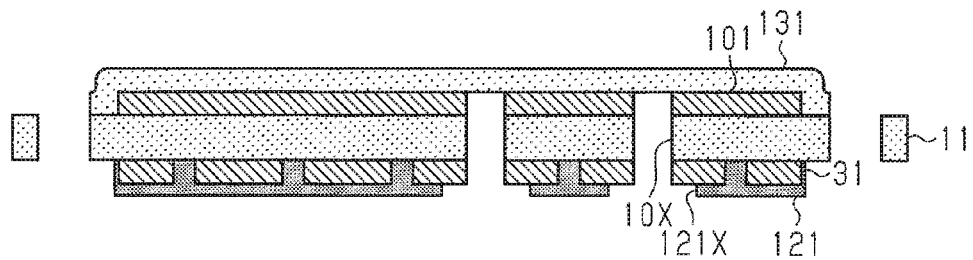

In the step of FIG. 4A, a masking tape 131, which serves as mask material, is applied to the copper foil 101, which is free from the resist layer 121. The masking tape 131 may be formed by, for example, applying an acrylic adhesive to a resin film of polyvinyl chloride, polyethylene terephthalate (PET), or the like. The masking tape 131 is also applied to the insulation substrate 11 to cover side surfaces of the copper foil 101 (surfaces at left and right ends of copper foil 101 as viewed in FIG. 4A).

Figure 4B:
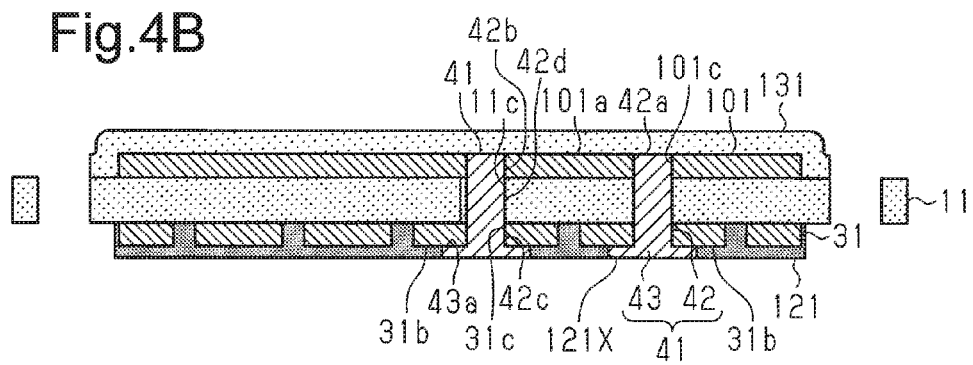

In the step of FIG. 4B, electrolytic plating (e.g., electrolytic copper plating) is performed using the copper foil 101 as a power feeding electrode to form the through wirings 41 in the through holes 10X. The through wirings 41 may be formed from, for example, copper or a copper alloy.

When using the copper foil 101 as the power feeding electrode, the deposit of electrolytic plating metal (copper plating metal) grows from an inner surface portion 101c of the copper foil 101. As a result, each through hole 10X is filled with the grown plating metal that forms the barrel 42. The upper end of each through hole 10X is covered by the masking tape 131. This flattens the upper surface 42a of the barrel 42. Further, the upper surface 42a of the barrel 42 is flush with the upper surface 101a of the copper foil 101.

The deposit of electrolytic plating metal (copper plating metal) also grows on the portion of the resist layer 121 exposed in each opening 121X. The grown plating metal forms the projection 43. In accordance with the size of the opening 121X, the projection 43 extends along the lower surface 31b of the wiring layer 31 located outside the corresponding through hole 10X.

In this manner, electrolytic plating (electrolytic copper plating) is performed to form the through wirings 41. The circumferential surface of the upper end portion of each through wiring 41, that is, the circumferential surface 42b of the barrel 42 is bonded to the inner surface portion 101c of the copper foil 101. Additionally, the circumferential surface 42c of the lower end portion of the barrel 42 is bonded to the inner surface portion 31c of the wiring layer 31. The upper surface 43a of the projection 43 is bonded to the lower surface 31b of the wiring layer 31. In contrast, the circumferential surface of the middle portion of each through wiring 41, that is, the circumferential surface 42d of the middle portion of the barrel 42 is in contact with but not bonded to the inner surface portion 11c of the insulation substrate 11.

Figure 4C:
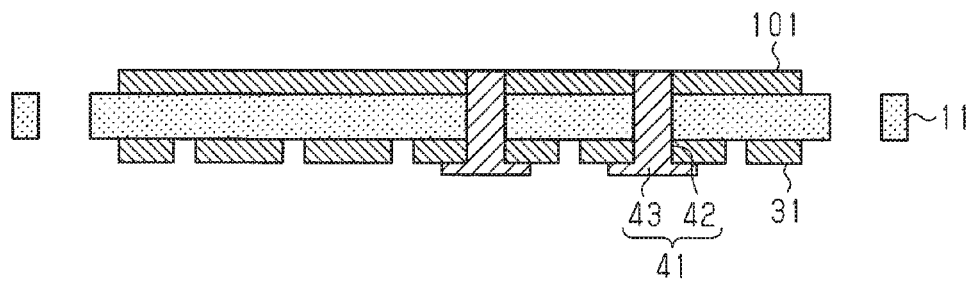

In the step of FIG. 4C, the resist layer 121 and the masking tape 131 illustrated in FIG. 4B are removed. The resist layer 121 may be delaminated by, for example, an alkali delamination liquid.

Figure 4D:
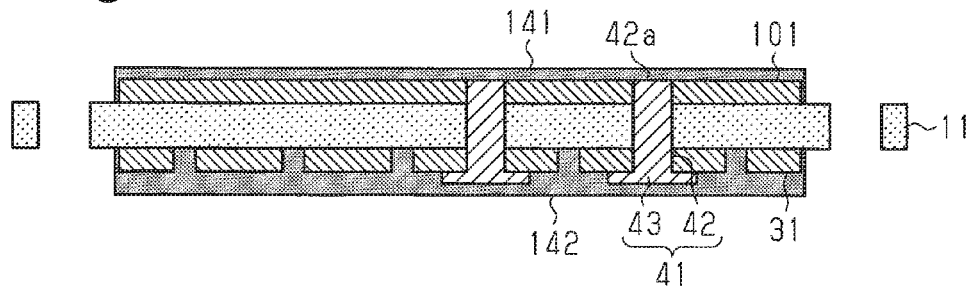

In the step of FIG. 4D, roll coating is performed to coat and cover the copper foil 101 and the upper surface of each through wiring 41 (i.e., upper surface 42a of each barrel 42) with a liquid photoresist while smoothening the surface of the resist to form a resist layer 141. The resist layer 141 corresponds to a second etching mask. Further, roll coating is performed to coat and cover the wiring layer 31 and the lower end portion of each through wiring 41 (i.e., each projection 43) while smoothening the surface of the resist to form a resist layer 142.

Figure 5A:
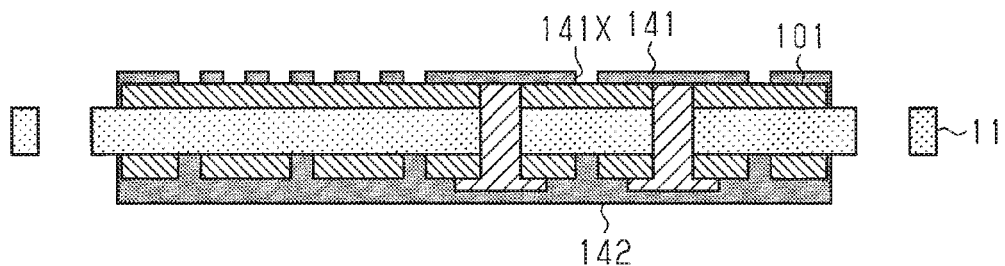

In the step of FIG. 5A, the resist layer 141 is exposed and developed to form openings 141X at given locations. The locations of the openings 141X correspond to the shape of the wiring patterns of the wiring layer 21 illustrated in FIG. 1A.

Figure 5B:
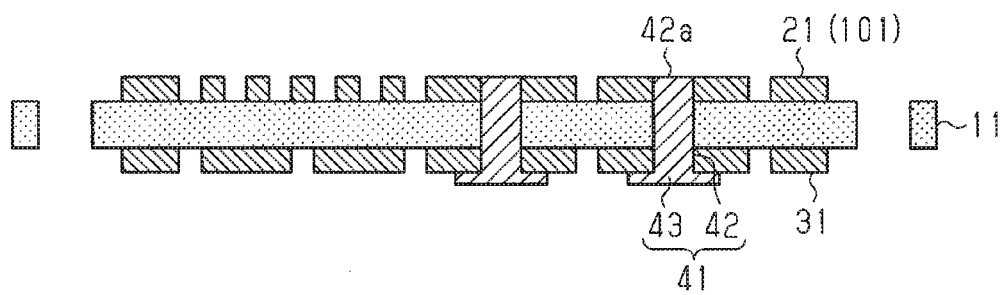

In the step of FIG. 5B, the copper foil 101 exposed in the openings 141X of the resist layer 141 is etched using the resist layer 141 illustrated in FIG. 5A as an etching mask to pattern the copper foil 101. This forms the wiring patterns in the wiring layer 21. Here, the wiring layer 31 is covered by the resist layer 142 and thus not etched. Then, the resist layers 141 and 142 illustrated in FIG. 5A are removed. The resist layers 141 and 142 may be delaminated by, for example, an alkali delamination liquid.

Figure 5C:
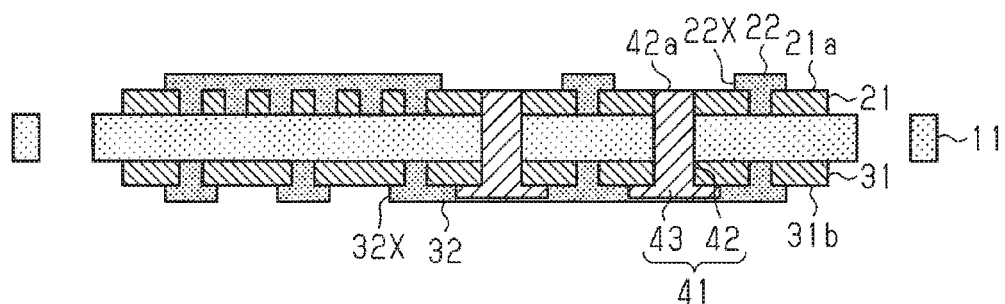

In the step of FIG. 5C, the protective layer 22, which includes the openings 22X, and the protective layer 32, which includes the openings 32X, are formed. The protective layers 22 and 32 may be formed from, for example, a photosensitive and insulative epoxy resin or a photosensitive and insulative acrylic resin. The protective layers 22 and 32 may be formed by, for example, laminating a photosensitive solder resist film or applying a liquid solder resist. Further, photolithography is performed to form the openings 22X, which expose portions of the wiring layer 21 and the upper surface 42a of the barrel 42 of each through wiring 41, at given locations in the protective layer 22. In the same manner, photolithography is performed to form the openings 32X, which expose portions of the wiring layer 31, at given locations in the protective layer 32.

Figure 5D:
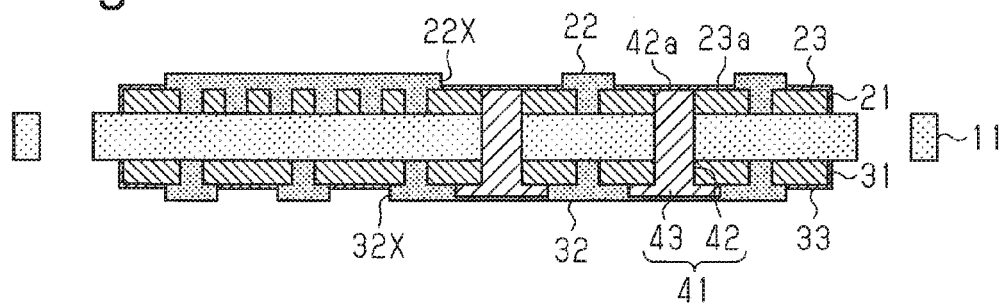

In the step of FIG. 5D, the surface-processed layer 23 is formed to cover the upper surface and side surfaces of the wiring layer 21 exposed from the protective layer 22. Further, the surface-processed layer 23a is formed to cover the upper surface of the wiring layer 21 and the upper surface of each through wiring 41 (upper surface 42a of each barrel 42) exposed from the protective layer 22. In addition, the surface-processed layer 33 is formed to cover the surface of the wiring layer 31 exposed from the protective layer 32. For example, when the surface-processed layers 23, 23a, and 33 are Ni/Au layers, an Ni layer is formed on the surfaces of the wiring layers 21 and 31 and the upper surface of each barrel 42, and an Au layer is formed on the Ni layer. The Ni layer and the Au layer may be formed through, for example, electroless plating.

The operation of the wiring substrate 10 will now be described.

The wiring substrate 10 includes the flexible insulation substrate 11, the wiring layer 21 formed on the upper surface 11a of the insulation substrate 11, and the wiring layer 31 formed on the lower surface 11b of the insulation substrate 11. The wiring substrate 10 includes the through holes 10X, which extend through the wiring layer 21, the insulation substrate 11, and the wiring layer 31. The through wirings 41 are formed in the through holes 10X. The through wirings 41 are bonded to the inner surface portion 21c of the wiring layer 21 that defines the upper end portion of each through hole 10X. Further, the through wirings 41 are bonded to the inner surface portion 31c of the wiring layer 31 that defines the lower end portion of each through hole 10X.

The through wirings 41 are formed through electrolytic plating. Electrolytic plating is performed using the wiring layer 21 (copper foil 101) as a power feeding electrode to deposit plating metal on the inner surface portion 21c of the wiring layer 21. The plating metal grows in the through holes 10X. This fills the through holes 10X with the grown plating metal, and the grown plating metal (through wirings 41) is bonded to the inner surface portion 31c of the wiring layer 31. Accordingly, the wiring layers 21 and 31 do not include the plating metal used when forming the through wirings 41. The wiring layers 21 and 31 are formed by patterning the copper foils 101 and 102. Thus, the wiring layers 21 and 31 each have a thickness that is uniform over the entire surface of the wiring substrate 10. This allows the wiring layers 21 and 31 to be finely patterned.

Referring to FIG. 1B, the electronic components 71 and 81 are mounted on the wiring substrate 10. The heat of the electronic component 71 is transmitted via the solder balls 72 to the wiring substrate 10, and the heat of the electronic component 81 is transmitted via the solder 82 to the wiring substrate 10. The wiring layers 21 and 31 of the wiring substrate 10 are formed from copper or a copper alloy. The through wirings 41 are formed from a plating metal of copper or a copper alloy. Accordingly, the coefficient of thermal expansion (CTE) of the wiring layers 21 and 31 is equal to that of the through wirings 41. In other words, there is no difference in the coefficient of thermal expansion of the wiring layers 21 and 31 and the coefficient of thermal expansion of the through wirings 41. Thus, defects due to the difference in the coefficient of thermal expansion are limited.

When forming the through wirings 41 through electrolytic plating, the circumferential surface at the middle portion of each through wiring 41 (circumferential surface 42d of barrel 42) contacts but does not bond to the inner surface portion 11c of the insulation substrate 11 defining the middle portion of the corresponding through hole 10X. This limits the transmission of stress to the through wirings 41 that is produced by contraction and expansion of the wiring substrate 10 resulting from bending and heat. Thus, cracking or the like of the through wirings 41 is limited.

The present embodiment has the advantages described below.

(1) The wiring substrate 10 includes the flexible insulation substrate 11, the wiring layer 21 formed on the upper surface 11a of the insulation substrate 11, and the wiring layer 31 formed on the lower surface 1ib of the insulation substrate 11. The wiring substrate 10 includes the through holes 10X that extend through the wiring layer 21, the insulation substrate 11, and the wiring layer 31. The through wirings 41 are formed in the through holes 10X. The through wirings 41 include the barrels 42 that fill the through holes 10X. Further, the through wirings 41 include the projections 43 that project downward from the lower surface 31b of the wiring layer 31. The barrel 42 of each through wiring 41 is bonded to the wiring layers 21 and 31. The upper surface 42a of the barrel 42 of each through wiring 41 is flush with the upper surface 21a of the wiring layer 21.

The through wirings 41 are formed through, for example, electrolytic plating. The wiring layer 21 (copper foil 101) is used as a power feeding electrode to perform electrolytic plating and deposit plating metal on the inner surface portion 21c of the wiring layer 21. The plating metal grows in the through holes 10X. This fills the through holes 10X with the grown plating metal, and the grown plating metal (through wirings 41) is bonded to the inner surface portion 31c of the wiring layer 31. Accordingly, the wiring layers 21 and 31 do not include the plating metal used for formation of the through wirings 41. The wiring layers 21 and 31 are formed by patterning the copper foils 101 and 102. Thus, the wiring layers 21 and 31 each have a thickness that is uniform over the entire surface of the wiring substrate 10. This allows the wiring layers 21 and 31 to be finely patterned.

(2) The masking tape 131 is applied to the upper surface 101a of the copper foil 101 so as to close the upper ends of the through holes 10X. Electrolytic plating is performed using the copper foil 101 as a power feeding electrode to form the through wirings 41 in the through holes 10X. Since the upper ends of the through holes 10X are closed by the masking tape 131, the upper surface 42a of each barrel 42 is planar. Further, the upper surface 42a of each barrel 42 is flush with the upper surface 101a of the copper foil 101. Thus, the upper surface 42a of the barrel 42 and the upper surface 21a of the wiring layer 21, which is formed by the copper foil 101, are continuous and flat. As a result, the surface-processed layer 23a, which is formed on the upper surface 42a of the barrel 42 and the upper surface 21a of the wiring layer 21, is suitable for use as the external connection terminals P1.

(3) Each through wiring 41 includes the barrel 42, which is formed in the corresponding through hole 10X, and the projection 43, which projects out of the lower surface 31b of the wiring layer 31 and extends along the lower surface 31b of the wiring layer 31 located outside the through hole 10X. Thus, the area where the through wiring 41 and the wiring layer 31 are joined is increased compared to when the through wiring 41 includes only the barrel 42. This improves the connection reliability of the through wirings 41 and the wiring layer 31.

(4) A stamping machine that performs stamping with a die is used to form the through holes 10X, which extend through the wiring layer 21 (copper foil 101), the insulation substrate 11, and the wiring layer 31 (the copper foil 102). Thus, the through holes 10X are easily formed within a short period of time.

It should be apparent to those skilled in the art that the foregoing embodiments may be employed in many other specific forms without departing from the scope of the invention. Particularly, it should be understood that the foregoing embodiments may be employed in the following forms.

The step of FIG. 2D in the above embodiment forms the resist layers 111 and 112 by coating the copper foils 101 and 102 with a liquid photoresist while smoothening the resist surface. Instead, the resist layer 111, which is located on the copper foil 101 that is not subject to etching, may be formed by another resist. Since the copper foil 101 is not etched, the resist layer may be thick. It is preferable that the resist layer be bonded to the copper foil 101. For example, a resist having satisfactory bonding characteristics such as a dry resist film may be used.

In the above embodiment, as illustrated in FIG. 1A, the wiring substrate 10 includes the sprocket holes 12. However, the insulation substrate 11 may be cut at portions where the sprocket holes 12 are formed. In other words, the wiring substrate 10 does not have to include the sprocket holes 12.

In the above embodiment, the electronic components 71 and 81 are mounted on the external connection terminals P1 and P2. Other wiring substrates may be mounted instead of the electronic components 71 and 81. Alternatively, the external connection terminals P1 and P2 of the wiring substrate 10 may be used to mount a substrate such as a motherboard.

CLAUSES

This disclosure further encompasses embodiments described below.

1. A method for manufacturing a wiring substrate, the method including:
preparing a clad laminate, wherein the clad laminate includes a flexible insulation substrate, a first metal foil for a first wiring layer, and a second metal foil for a second wiring layer, and wherein the first metal foil is formed on an upper surface of the insulation substrate and the second metal foil is formed on a lower surface of the insulation substrate;
forming a first etching mask that covers the second metal foil and includes an opening;
forming the second wiring layer by patterning the second metal foil using the first etching mask;
removing the first etching mask;
forming a plating mask that covers the second wiring layer;
forming a through hole that extends through the first metal foil, the insulation substrate, and the second wiring layer by performing stamping;
closing the through hole by applying a mask material to an upper surface of the first metal foil;
forming a through wiring in the through hole by performing electrolytic plating using the first metal foil as a power feeding electrode;
removing the plating mask and the mask material;
forming a second etching mask that covers the first metal foil and includes an opening;
forming the first wiring layer by patterning the first metal foil using the second etching mask; and
removing the second etching mask.

2. The method according to clause 1, wherein at least one of the first etching mask and the second etching mask is formed by a photosensitive liquid resist.

3. The method according to clause 1 or 2, wherein
the plating mask that covers the second wiring layer includes an opening that is larger than the through hole and located at a position where the through hole is formed,
the through hole is formed at an inner side of the opening in the plating mask, and
the forming a through wiring includes forming a projection that projects downward out of a lower surface of the second wiring layer and extends along the lower surface of the second wiring layer.

4. The method according to clause 3, further including:
forming a first protective layer that covers a portion of the first wiring layer and includes an opening exposing an upper surface of the through wiring and an upper surface of the first wiring layer located at an outer side of the through wiring; and forming a second protective layer that covers a portion of the second wiring layer and the through wiring and includes an opening that exposes a portion of the lower surface of the second wiring layer.

5. The method according to clause 4, further including:

forming a first surface-processed layer that covers a surface of the first wiring layer and the upper surface of the through wiring that are exposed from the first protective layer; and forming a second surface-processed layer that covers a surface of the second wiring layer exposed from the second protective layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a flexible insulation substrate;
a first wiring layer formed on an upper surface of the insulation substrate;
a second wiring layer formed on a lower surface of the insulation substrate; and
a through wiring formed in a through hole extending through the first wiring layer, the insulation substrate, and the second wiring layer, the through wiring being bonded to the first wiring layer and the second wiring layer and, wherein
the through wiring includes a projection that extends along a lower surface of the second wiring layer located outside the through hole, and
an upper surface of the through wiring is flush with an upper surface of the first wiring layer.

2. The wiring substrate according to claim 1, wherein:
the projection extends in an annular manner on the lower surface of the second wiring layer located outside the through hole; and
the projection includes an upper surface that is directly bonded to the lower surface of the second wiring layer.

3. The wiring substrate according to claim 1, wherein:
the through wiring includes a barrel that fills the through hole;
the projection is integrally formed with the barrel and projects downward from the lower surface of the second wiring layer; and
the barrel includes:
an upper end portion including a circumferential surface directly bonded to an inner surface portion of the first wiring layer;
a lower end portion including a circumferential surface directly bonded to an inner surface portion of the second wiring layer; and
a middle portion located between the upper end portion and the lower end portion and including a circumferential surface, wherein the circumferential surface of the middle portion is in contact with an inner surface portion of the insulation substrate.

4. The wiring substrate according to claim 1, wherein the through wiring is formed from a plating metal.

5. The wiring substrate according to claim 1, further comprising:
a first protective layer that covers a portion of the first wiring layer and includes an opening exposing the upper surface of the through wiring and the upper surface of the first wiring layer located at an outer side of the through wiring; and
a second protective layer that covers a portion of the second wiring layer and the through wiring and includes an opening exposing a portion of the lower surface of the second wiring layer.

6. The wiring substrate according to claim 5, further comprising:
a first surface-processed layer that covers a surface of the first wiring layer and the upper surface of the through wiring that are exposed from the first protective layer; and
a second surface-processed layer that covers a surface of the second wiring layer exposed from the second protective layer.

7. A semiconductor device comprising:
a wiring substrate according to claim 1; and
at least one electronic component mounted on the wiring substrate.

* * * * *